US012615869B2

(12) United States Patent
Chang et al.

(10) Patent No.: US 12,615,869 B2
(45) Date of Patent: Apr. 28, 2026

(54) IMAGE SENSOR

(71) Applicant: Samsung Electronics Co., Ltd.,
Suwon-si (KR)

(72) Inventors: Kyoungeun Chang, Hwaseong-si (KR);
Hyunchul Kim, Seoul (KR); **Jinyoung
Kim, Suwon-si (KR); Donghyun Kim**,
Hwaseong-si (KR); Sungin Kim,
Hwaseong-si (KR)

(73) Assignee: **SAMSUNG ELECTRONICS CO.,
LTD.**, Suwon-si (KR)

(*) Notice: Subject to any disclaimer, the term of this
patent is extended or adjusted under 35
U.S.C. 154(b) by 758 days.

(21) Appl. No.: 17/671,651

(22) Filed: Feb. 15, 2022

(65) Prior Publication Data

US 2022/0392930 A1 Dec. 8, 2022

(30) Foreign Application Priority Data

Jun. 4, 2021 (KR) ........................ 10-2021-0072970

(51) Int. Cl.
*H10F 39/00* (2025.01)
*H10F 39/18* (2025.01)
(52) U.S. Cl.
CPC ......... *H10F 39/807* (2025.01); *H10F 39/014*
(2025.01); *H10F 39/182* (2025.01); *H10F
39/8053* (2025.01); *H10F 39/8063* (2025.01)
(58) Field of Classification Search
None
See application file for complete search history.

(56) References Cited

U.S. PATENT DOCUMENTS

| | | | |
|---|---|---|---|
| 9,196,547 B2 | 11/2015 | Lin et al. | |
| 9,324,603 B2 | 4/2016 | Tsai et al. | |
| 9,420,209 B2 | 8/2016 | Ahn et al. | |
| 10,347,679 B2 | 7/2019 | Kato et al. | |
| 10,833,117 B2 | 11/2020 | Shim | |
| 2014/0246707 A1 | 9/2014 | Koo et al. | |
| 2015/0372036 A1* | 12/2015 | Suh ...................... | H10F 39/806 |
| | | | 257/432 |
| 2017/0287975 A1* | 10/2017 | Koo .................. | H10F 39/80373 |

(Continued)

FOREIGN PATENT DOCUMENTS

| | | | |
|---|---|---|---|
| JP | 2012084748 A | 4/2012 | |
| JP | 2015023259 A | 2/2015 | |

(Continued)

*Primary Examiner* — Yara B Green
*Assistant Examiner* — Seth D Lawson
(74) *Attorney, Agent, or Firm* — Muir Patent Law, PLLC

(57) ABSTRACT

An image sensor includes: a substrate having a first surface
on which light is incident and a second surface opposite to
the first surface; a pixel isolation structure enclosing a pixel
region in the substrate; a photoelectric conversion region in
the pixel region; and a device isolation layer defining a
pattern in the pixel region, wherein the device isolation layer
includes a first portion contacting the pixel isolation struc-
ture and a second portion spaced apart from the pixel
isolation structure, the device isolation layer extends from a
second surface of the substrate into the substrate, and a
length of the second portion of the device isolation layer in
a vertical direction perpendicular to the first surface of the
substrate is less than a length of the first portion of the device
isolation layer in the vertical direction.

20 Claims, 19 Drawing Sheets

100

(56)            References Cited

U.S. PATENT DOCUMENTS

2020/0219920  A1*    7/2020   Hur ..................... H10F 39/8053
2020/0266221  A1     8/2020   Uchida et al.
2020/0381464  A1    12/2020   Hong et al.

FOREIGN PATENT DOCUMENTS

JP          2015162679  A     9/2015
JP          2019125784  A     7/2019
KR      1020140108940  A     9/2014
KR      1020200084719  A     7/2020

* cited by examiner

IMAGE SENSOR

CROSS-REFERENCE TO RELATED APPLICATION

This application is based on and claims priority under 35 U.S.C. § 119 to Korean Patent Application No. 10-2021-0072970, filed on Jun. 4, 2021, in the Korean Intellectual Property Office, the disclosure of which is incorporated by reference herein in its entirety.

BACKGROUND

The inventive concept relates to an image sensor, and more particularly, to a complementary metal oxide semiconductor (CMOS) image sensor.

Image sensors may include charge coupled device (CCD) image sensors and CMOS image sensors. A CMOS image sensor may be driven using a simple method, and has the ability to integrate signal processing circuits onto a single chip, thereby enabling miniaturization of the product. A CMOS image sensor may also be applied to products with limited battery capacity due to its low power consumption. Furthermore, a CMOS image sensor may be fabricated using CMOS process technology, and accordingly, manufacturing costs may be reduced. In addition, as a CMOS image sensor may achieve a high resolution together with technological development, consumer demand for CMOS image sensors is increasing.

SUMMARY

The inventive concept provides an image sensor having a shallow trench structure that reduces dark level current due to damage caused by shallow trench etch and decreases leakage current between doped regions.

According to an aspect of the inventive concept, there is provided an image sensor including: a substrate having a first surface on which light is incident and a second surface opposite to the first surface; a pixel isolation structure enclosing a pixel region in the substrate; a photoelectric conversion region in the pixel region; and a device isolation layer defining a pattern in the pixel region, wherein the device isolation layer includes a first portion contacting the pixel isolation structure and a second portion spaced apart from the pixel isolation structure, the device isolation layer extends from a second surface of the substrate into the substrate, and a length of the second portion of the device isolation layer in a vertical direction perpendicular to the first surface of the substrate is less than a length of the first portion of the device isolation layer in the vertical direction.

According to another aspect of the inventive concept, there is provided an image sensor including: a substrate having a first surface on which light is incident and a second surface opposite to the first surface; a pixel isolation structure in a deep trench, which defines a pixel region in the substrate; a photoelectric conversion region in the pixel region; and a device isolation layer provided in first and second shallow trenches and defining a pattern in the pixel region, wherein the first shallow trench is recessed into the substrate from the second surface of the substrate to a first depth in a vertical direction perpendicular to the first surface of the substrate, and connected to the deep trench, wherein the second shallow trench is recessed into the substrate from the second surface of the substrate to a second depth in the vertical direction, and connected to the first shallow trench, and wherein the first depth is greater than the second depth.

According to another aspect of the inventive concept, there is provided an image sensor including: a substrate having a first surface and a second surface opposite to each other; a micro lens on the first surface of the substrate; a pixel isolation structure in a deep trench, which defines a pixel region in the substrate; a photoelectric conversion region in the pixel region; a first doped region contacting the pixel isolation structure in the pixel region; a device isolation layer provided in first and second shallow trenches and defining a pattern in the pixel region; and a second doped region in the pattern, wherein impurities in the first doped region have a different conductivity type from that of impurities in the second doped region, wherein the first shallow trench is recessed into the substrate from the second surface of the substrate to a first depth in a vertical direction perpendicular to the first surface of the substrate, and connected to the deep trench, wherein the second shallow trench is recessed into the substrate from the second surface of the substrate to a second depth in the vertical direction, and connected to the first shallow trench, wherein the first shallow trench is above the first doped region, and wherein the first depth is greater than the second depth.

BRIEF DESCRIPTION OF THE DRAWINGS

Embodiments of the inventive concept will be more clearly understood from the following detailed description taken in conjunction with the accompanying drawings in which like numeral refer to like elements throughout. In the drawings:

FIG. 2 is a cross-sectional view of an image sensor, according to example embodiments of the inventive concept, taken along line A-A' of FIG. 1;

FIG. 3 is a cross-sectional view of an image sensor, according to example embodiments of the inventive concept, taken along line B-B' of FIG. 1;

FIG. 4 is a cross-sectional view of an image sensor, according to example embodiments of the inventive concept;

DETAILED DESCRIPTION OF THE EMBODIMENTS

Figure 1:
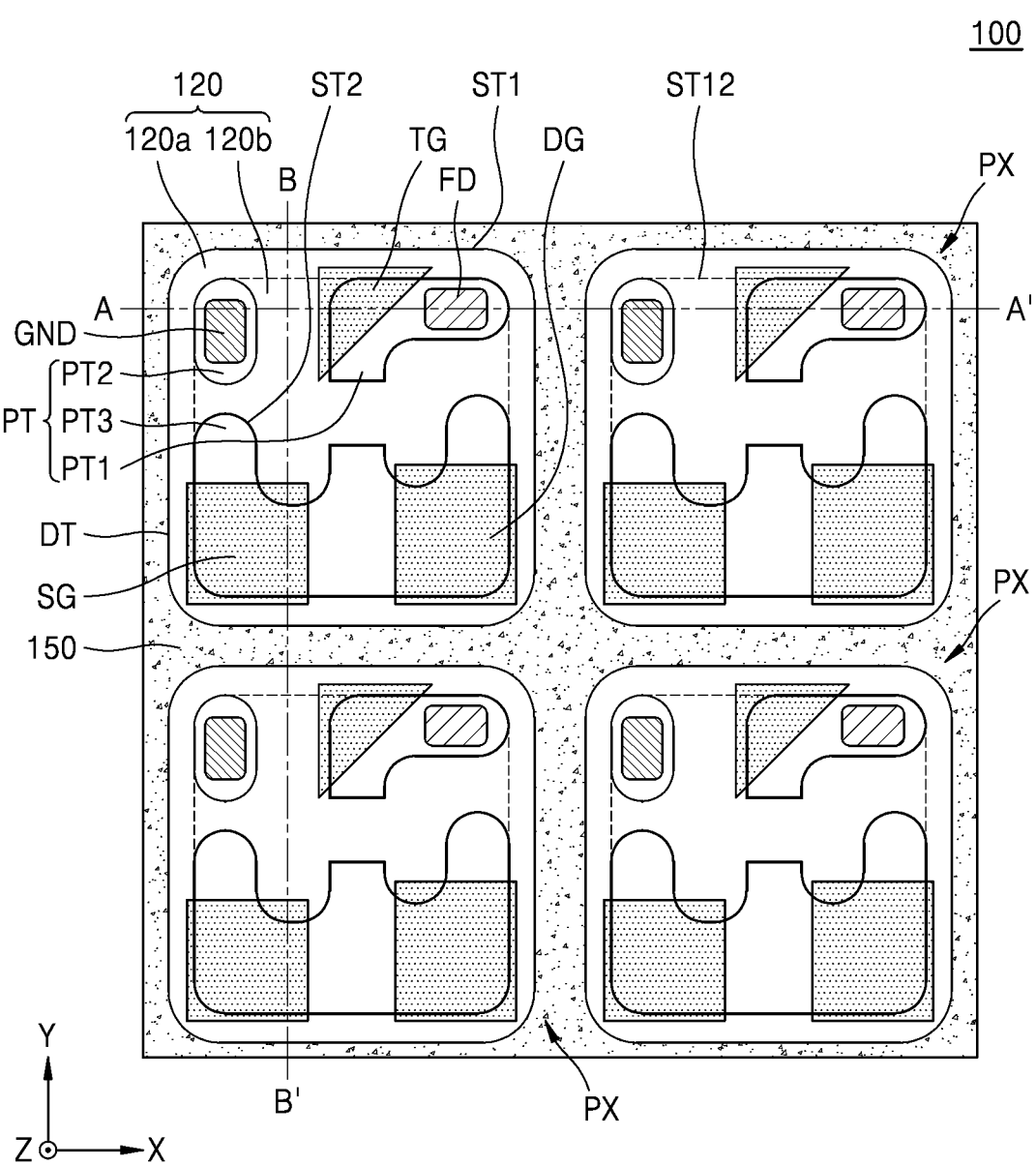
FIG. 1 is a plan view of an image sensor, according to example embodiments of the inventive concept.
Figure 2:
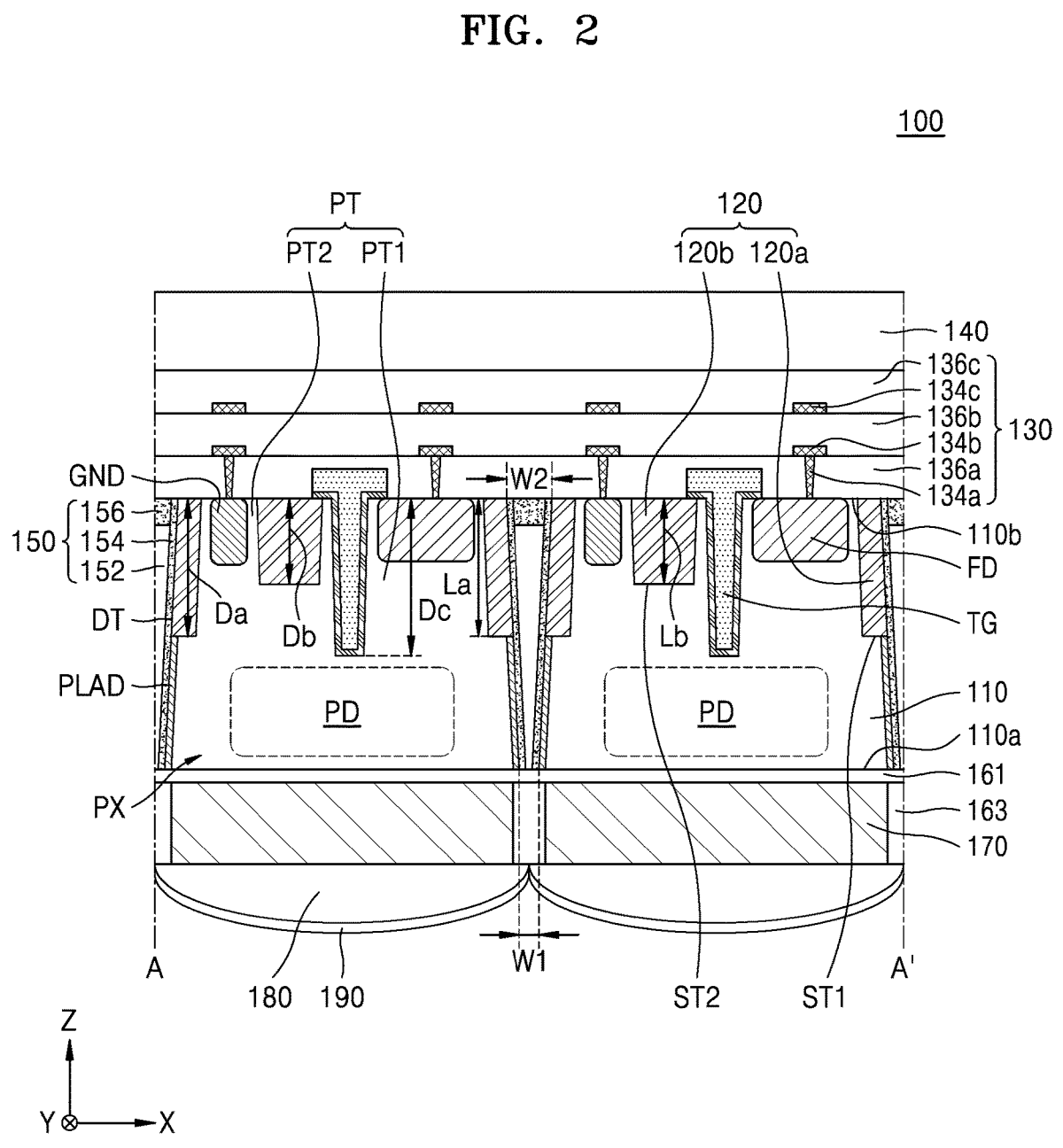
Figure 3:
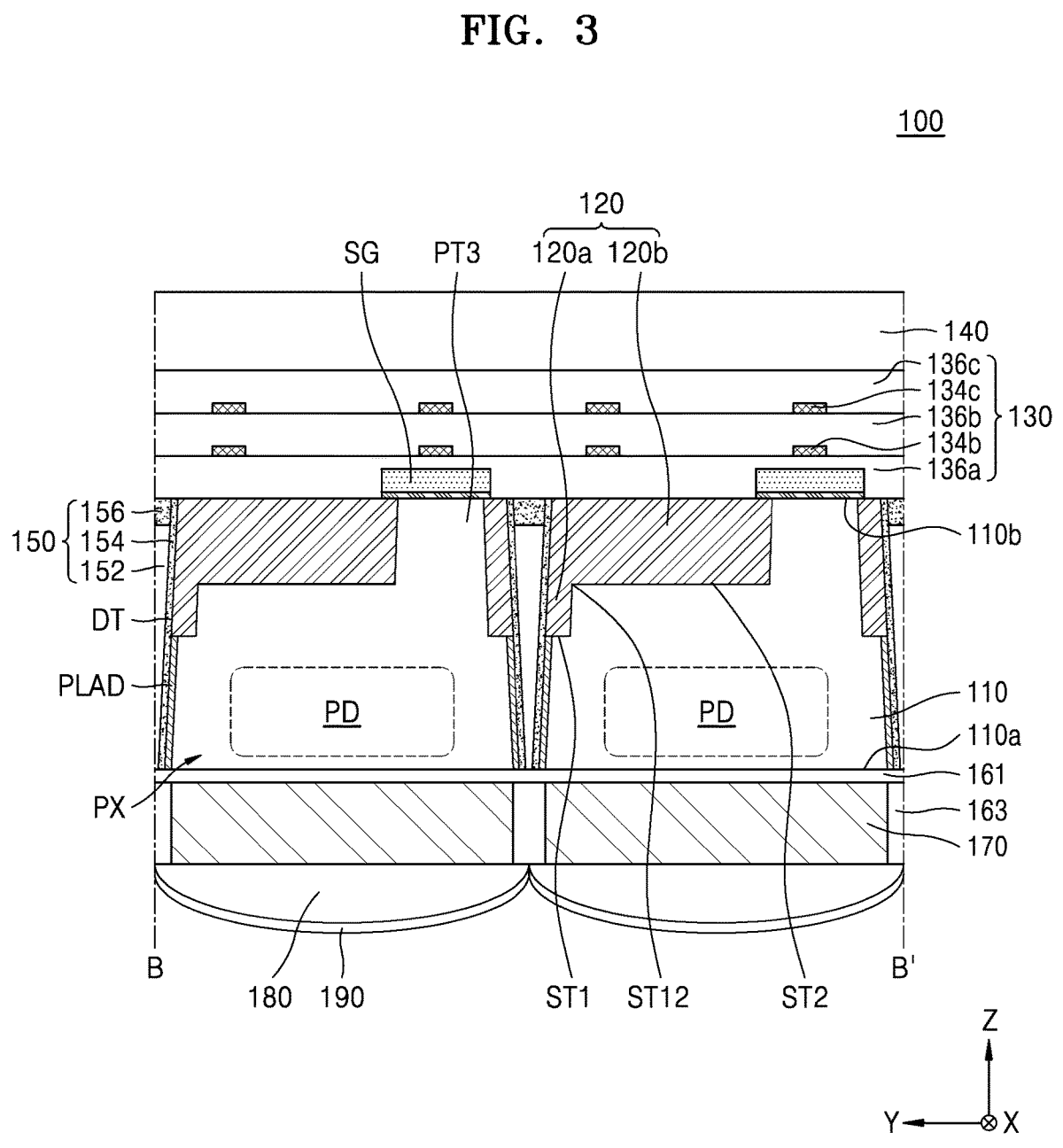

FIG. 1 is a plan view of an image sensor 100, according to example embodiments of the inventive concept. FIG. 2 is a cross-sectional view of the image sensor 100 according to example embodiments of the inventive concept, taken along line A-A' of FIG. 1. FIG. 3 is a cross-sectional view of the image sensor 100, according to example embodiments of the inventive concept, taken along line B-B' of FIG. 1.

Referring to FIGS. 1 through 3, the image sensor 100 may include a substrate 110, a plurality of micro lenses 180, a pixel isolation structure 150 in a deep trench DT, a plurality of photoelectric conversion regions PD, and a device isolation layer 120 in first and second shallow trenches ST1 and ST2. In some embodiments, the image sensor 100 may further include a plurality of first doped regions PLAD and a plurality of second doped regions FD. In some embodiments, the image sensor 100 may further include a plurality of third doped regions GND. In some embodiments, the image sensor 100 may further include transfer gates TG, select gates SG, and drive gates DG. In some embodiments, the image sensor 100 may further include a front structure 130. In some embodiments, the image sensor 100 may further include a support substrate 140. In some embodiments, the image sensor 100 may further include a backside anti-reflective layer 161. In some embodiments, the image sensor 100 may further include a fence 163 and a plurality of color filters 170. In some embodiments, the image sensor 100 may further include a capping layer 190.

The substrate 110 may have a first surface 110*a* and a second surface 110*b* that are opposite to each other. The first surface 110*a* and the second surface 110*b* may be substantially parallel to one another. The first surface 110*a* may be where light is incident and may be perpendicular to a vertical direction (Z direction). Typically, the first surface 110*a* and the second surfaces 110*b* may also be referred to as a back surface and a front surface, respectively. The substrate 110 may include a semiconductor material such as a group IV semiconductor material, a group III-V semiconductor material, or a group II-VI semiconductor material. The group IV semiconductor material may include, for example, silicon (Si), germanium (Ge), or Si-Ge. The group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The group II-VIf semiconductor material may include, for example, zinc telluride (ZnTe) or cadmium sulfide (CdS).

The deep trench DT may define a plurality of pixel regions PX in the substrate 110. For example, the deep trench DT may separate the plurality of pixel regions PX from one another. The plurality of pixel regions PX may be arranged in a two-dimensional (2D) array. Although FIG. 1 shows that four pixel regions PX are arranged in a 2×2 matrix, the number and arrangement of the pixel regions PX are not limited thereto. For example, the number of pixel regions PX provided in the substrate 110 may be greater than four.

In some embodiments, the deep trench DT may penetrate the substrate 110 from the first surface 110*a* to the second surface 110*b* of the substrate 110. The deep trench DT may be formed using a front-side deep trench isolation (FDTI) process in which the substrate 110 is etched from the second surface 110*b* (i.e., the front surface) of the substrate 110.

The pixel isolation structure 150 may be provided in the deep trench DT. The pixel isolation structure 150 may enclose each of the plurality of pixel regions PX. The pixel isolation structure 150 may separate the plurality of pixel regions PX from one another. When the deep trench DT is formed using FDTI, the pixel isolation structure 150 may penetrate the substrate 110 from the first surface 110*a* to the second surface 110*b* of the substrate 110. Furthermore, due to the FDTI process, a width W1 of the pixel isolation structure 150 on the first surface 110*a* of the substrate 110 may be less than a width W2 of the pixel isolation structure 150 on the second surface 110*b* of the substrate 110.

The pixel isolation structure 150 may include an insulating pattern 154, a conductive pattern 152, and a capping pattern 156. The insulating pattern 154 may cover an inner sidewall of the deep trench DT. The capping pattern 156 may be provided on the insulating pattern 154 to fill an upper portion of the deep trench DT. The conductive pattern 152 may be provided on the insulating pattern 154 to fill a lower portion of the deep trench DT. A top surface of the capping pattern 156 may be coplanar with the second surface 110*b* of the substrate 110, and a bottom surface of the conductive pattern 152 may be coplanar with the first surface 110*a* of the substrate 110. The insulating pattern 154 may extend from the first surface 110*a* to the second surface 110*b* of the substrate 110. The conductive pattern 152 may be electrically separated from the substrate 110 by the insulating pattern 154. In some embodiments, the capping pattern 156 may be omitted. In this case, the conductive pattern 152 may extend from the first surface 110*a* to the second surface 110*b* of the substrate 110, and a top surface of the conductive pattern 152 may be coplanar with the second surface 110*b* of the substrate 110.

In some embodiments, the conductive pattern 152 may include a metallic material or a semiconductor material such as polysilicon doped with n- or p-type impurities. In some embodiments, the insulating pattern 154 and the capping pattern 156 may each include silicon oxide, silicon nitride, or silicon oxynitride. In other embodiments, the insulating pattern 154 may include metal oxide such as hafnium oxide, aluminum oxide, tantalum oxide, etc., and in this case, the insulating pattern 154 may act as a negative fixed charge layer.

The plurality of photoelectric conversion regions PD may be respectively arranged in the plurality of pixel regions PX. Each of the photoelectric conversion regions PD may convert an optical signal into an electrical signal. The photoelectric conversion region PD may include a photodiode, a phototransistor, a photogate, a pinned photodiode (PPD), or a combination thereof. The photoelectric conversion region PD may include a doped region doped with impurities of a conductivity type opposite to that of the substrate 110.

The first and second shallow trenches ST1 and ST2 may define a pattern PT in each of the pixel regions PX. The first shallow trench ST1 may be recessed into the substrate 110 from the second surface 110*b* of the substrate 110 to a first depth Da in the vertical direction (Z direction), and connected to the deep trench DT. The second shallow trench ST2 may be recessed into the substrate 110 from the second surface 110*b* of the substrate 110 to a second depth Db in the vertical direction (Z direction), and connected to the first shallow trench ST1. In this case, the first depth Da may be greater than the second depth Db. For example, the first depth Da may be about 2000 Å to about 3000 Å, and the second depth Db may be about 200 Å to about 1000 Å, so a difference between the first depth Da and the second depth Db may range from about 1000 Å to about 2800 Å. In some embodiments, the first shallow trench ST1 may be connected to the deep trench DT along a perimeter of the pixel region PX.

A boundary ST12 between the first and second shallow trenches ST1 and ST2 is indicated by a dashed line in FIG. 1. A shape of the boundary ST12 between the first shallow trench ST1 and the second shallow trench ST2 illustrated in FIG. 1 is merely an example, and may be variously modified. Because the first depth Da of the first shallow trench ST1 is different from the second depth Db of the second shallow trench ST2, there may be a step height difference at the boundary ST12 between the first and second shallow trenches ST1 and ST2, as shown in FIG. 3.

The device isolation layer 120 may be provided in the first and second shallow trenches ST1 and ST2. The device isolation layer 120 may include a first portion 120*a* in the first shallow trench ST1 and a second portion 120*b* in the second shallow trench ST2. The first portion 120*a* of the device isolation layer 120 may contact the pixel isolation structure 150, while the second portion 120b of the device isolation layer 120 may be spaced apart from the pixel isolation structure 150. The first portion 120a of the device isolation layer 120 may contact the pixel isolation structure 150 along the perimeter of the pixel region PX. A top surface of the device isolation layer 120 may be coplanar with the second surface 110b of the substrate 110. A length Lb of the second portion 120b of the device isolation layer 120 in the vertical direction (Z direction) may be less than a length La of the first portion 120a of the device isolation layer 120 in the vertical direction (Z direction). The device isolation layer 120 may include silicon oxide, silicon nitride, or a combination thereof. In example embodiments, the first portion 120a and the second portion 120b may be in material continuity. As used herein, the term "material continuity" may refer to structures, patterns, and/or layers that are formed at the same time and of the same material, without a break in the continuity of the material of which they are formed. As one example, structures, patterns, and/or layers that are in "material continuity" may be homogeneous monolithic structures.

The pattern PT may be a part of the substrate 110 defined by the first and second shallow trenches ST1 and ST2. In some embodiments, the pattern PT may include first through third patterns PT1 through PT3 spaced apart from one another. Shapes of the first through third patterns PT1 through PT3 illustrated in FIG. 1 are merely an example, and may be variously modified. A portion of the second shallow trench ST2 may extend between the first and second patterns PT1 and PT2. For example, a portion of second portion 120b of the device isolation layer 120 may extend between the first and second patterns PT1 and PT2.

A first doped region PLAD may contact the pixel isolation structure 150 in the pixel region PX. A second doped region FD may be located in the first pattern PT1. The first doped region PLAD may be below the first portion 120a of the device isolation layer 120. For example, the first doped region PLAD may be below the first shallow trench ST1 and contact the pixel isolation structure 150. For example, the first doped region PLAD may be between the first shallow trench ST1 and the first surface 110a of the substrate 110. In example embodiments, the first doped region PLAD may contact a side surface of the insulating pattern 154 of the pixel isolation structure 150 and a lower surface of the first portion 120a of the device isolation layer 120. Impurities in the first doped region PLAD may have a different conductivity type from that of impurities in the second doped region FD. For example, impurities in the first doped region PLAD may have a P-type conductivity while impurities in the second doped region FD may have an N-type conductivity. The second doped region FD may also be referred to as a floating diffusion region FD. The first doped region PLAD may mitigate an increase in a dark level current due to damage caused by etching of the deep trench DT.

A third doped region GND may be located in the second pattern PT2. Impurities in the third doped region GND may have a different conductivity type from that of the impurities in the second doped region FD. For example, the impurities in the third doped region GND may have the same conductivity type as that of the impurities in the first doped region PLAD. For example, the impurities in the third doped region GND may have a P-type conductivity, the impurities in the second doped region FD may have an N-type conductivity, and the impurities in the first doped region PLAD may have a P-type conductivity. The third doped region GND may be electrically grounded.

A transfer gate TG may be recessed into the substrate 110 from the second surface 110b thereof to a third depth Dc in the vertical direction (Z direction). The third depth Dc of the transfer gate TG may be greater than the second depth Db of the second shallow trench ST2. In some embodiments, the third depth Dc of the transfer gate TG may be greater than the first depth Da of the first shallow trench ST1. A select gate SG, a drive gate DG, and a reset gate (reset gate RG in FIG. 5) may be arranged on the third pattern PT3. A pixel circuit PXC including a photoelectric conversion region PD, a transfer gate TG, a floating diffusion region FD, a reset gate RG, a drive gate DG, and a select gate SG is described in more detail below with reference to FIG. 5.

The front structure 130 may be provided on the second surface 110b of the substrate 110. In some embodiments, the front structure 130 may contact the second surface 110b of the substrate 110. The front structure 130 may include a plurality of contacts 134a, a plurality of wiring layers, i.e., first and second wiring layers 134b and 134c, and a plurality of insulating layers, i.e., first, second, and third insulating layers 136a, 136b, and 136c. The first, second, and third insulating layers 136a, 136b, and 136c may enclose the contacts 134a and the first and second wiring layers 134b and 134c.

The contacts 134a and the first and second wiring layers 134b and 134c may be electrically coupled to a transfer gate TG, a reset gate RG, a select gate SG, a drive gate DG, a second doped region FD, or a third doped region on the second surface 110b of the substrate 110. Each of the first and second wiring layers 134b and 134c and the contacts 134a may include tungsten (W), aluminum (Al), copper (Cu), tungsten silicide, titanium silicide, tungsten nitride, titanium nitride, or doped polysilicon. Each of the first, second, and third insulating layers 136a, 136b, and 136c may include an insulating material such as silicon oxide, silicon nitride, silicon oxynitride, or a low dielectric constant (low-k) material. The low-k material may include, for example, flowable oxide (FOx), torene silazene (TOSZ), undoped silica glass (USG), borosilica glass (BSG), phosphosilica glass (PSG), borophosphosilica glass (BPSG), plasma enhanced tetraethyl orthosilicate (PETEOS), fluoride silicate glass (FSG), carbon doped silicon oxide (CDO), xerogel, aerogel, amorphous fluorinated carbon (AFC), organo silicate glass (OSG), parylene, bis-benzocyclobutenes (BCB), SiLK, polyimide, a porous polymeric material, or a combination thereof.

The support substrate 140 may be provided on the front structure 130. In some embodiments, an adhesive member (not shown) may be further arranged between the support substrate 140 and the front structure 130. The support substrate 140 may complement a strength of the substrate 110 during a manufacturing phase. The support substrate 140 may include, for example, a silicon substrate.

The backside anti-reflective layer 161 may be provided on the first surface 110a of the substrate 110. For example, the backside anti-reflective layer 161 may include hafnium oxide ($HfO_2$), silicon dioxide ($SiO_2$), silicon nitride (SiN), aluminum oxide ($Al_2O_3$), zirconium oxide ($ZrO_2$), tantalum oxide ($Ta_2O_5$), titanium oxide ($TiO_2$), lanthanum oxide ($La_2O_3$), praseodymium oxide ($Pr_2O_3$), cerium oxide ($CeO_2$), neodymium oxide ($Nd_2O_3$), promethium oxide ($Pm_2O_3$), samarium oxide ($Sm_2O_3$), europium oxide ($Eu_2O_3$), gadolinium oxide ($Gd_2O_3$), terbium oxide ($Tb_2O_3$), dysprosium oxide ($Dy_2O_3$), holmium oxide ($Ho_2O_3$), thulium oxide ($Tm_2O_3$), ytterbium oxide ($Yb_2O_3$), lutetium oxide ($Lu_2O_3$), yttrium oxide ($Y_2O_3$), or a combination thereof.

The fence 163 may be provided on the backside anti-reflective layer 161. The fence 163 may extend along the pixel isolation structure 150 in a plan view. The fence 163 may include a low-refractive-index material. For example, the low-refractive-index material may have a refractive index greater than about 1.0 and less than or equal to about 1.4. In example embodiments, the low-refractive-index material may include polymethyl metacrylate (PMMA), silicon acrylate (SA), cellulose acetate butyrate (CAB), silica, or fluoro-silicon acrylate (FSA). For example, the low-refractive-index material may include a polymer material in which silica particles are dispersed.

When the fence 163 includes a low-refractive-index material having a relatively low refractive index, light incident toward the fence 163 may be totally reflected and directed toward a center of each pixel region PX. The fence 163 may prevent light incident obliquely into each of the color filters 170 provided on one of the pixel regions PX from entering the color filter 170 provided on another neighboring pixel region PX, and accordingly, suppress crosstalk between the pixel regions PX.

The color filters 170 may be arranged on the backside anti-reflective layer 161 and separated from one another by the fence 163. The color filters 170 may be, for example, a combination of a green filter, a blue filter, and a red filter. In another embodiment, the color filters 170 may be, for example, a combination of a cyan filter, a magenta filter, and a yellow filter.

Each of the micro lenses 180 may be provided on the color filter 170 and the fence 163. The micro lenses 180 may be arranged to respectively correspond to the pixel regions PX. For example, the micro lenses 180 may contact lower surfaces of the fence 163 and the color filters 170. The micro lens 180 may be transparent. The micro lens 180 may be formed of, for example, a resin-based material such as a styrene-based resin, an acrylic resin, a styrene-acrylic copolymer-based resin, or a siloxane-based resin. The micro lens 180 may condense incident light onto the photoelectric conversion region PD through the color filter 170.

The capping layer 190 may be provided on the micro lens 180 to protect the micro lens 180. For example, the capping layer 190 may contact the micro lens 180.

According to the inventive concept, the first shallow trench ST1 having the first depth Da may be connected to the deep trench DT, and the second shallow trench ST2 having the second depth Db may be connected to the first shallow trench ST1, the first depth Da being greater than the second depth Db. The device isolation layer 120 may be provided in the first shallow trench ST1 and the second shallow trench ST2, and the pixel isolation structure 150 may be provided in the deep trench DT. Thus, the device isolation layer 120 may include the first portion 120a that is in contact with the pixel isolation structure 150 and the second portion 120b spaced apart from the pixel isolation structure 150, and the length Lb of the second portion 120b of the device isolation layer 120 may be less than the length La of the first portion 120a thereof.

Because the second depth Db of the second shallow trench ST2 is relatively small, an area of an etched side surface of the second shallow trench ST2 may be reduced. Thus, an increase in dark level current due to etching damage may be mitigated. Because the first depth Da of the first shallow trench ST1 is relatively large, the first doped region PLAD underlying the first shallow trench ST1 may be sufficiently separated from the second doped region FD in the first pattern PT1 in the vertical direction so that leakage current between the first doped region PLAD and the second doped region FD may be reduced.

Figure 4:
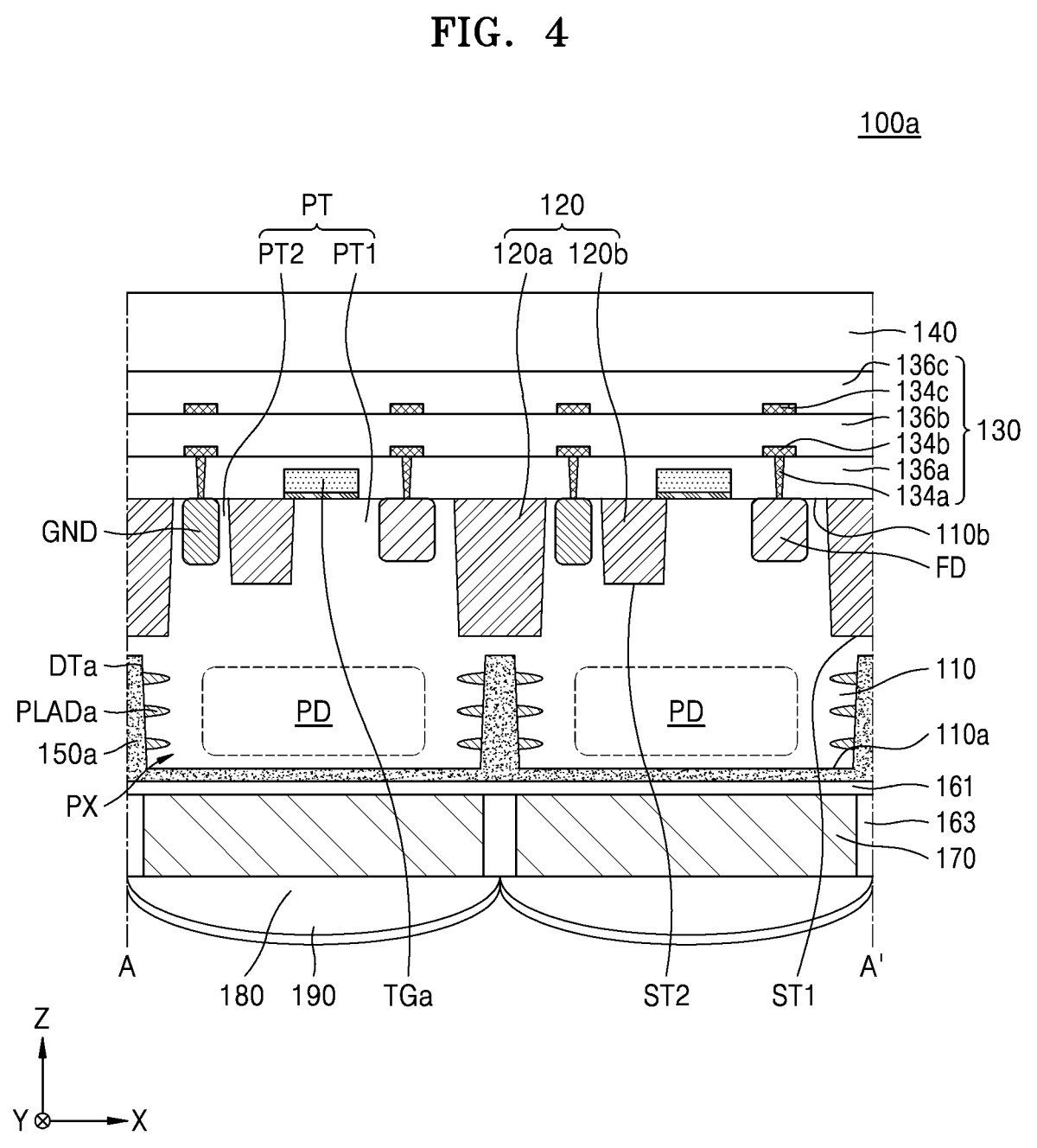

FIG. 4 is a cross-sectional view of an image sensor 100a, according to example embodiments of the inventive concept. FIG. 4 corresponds to a cross-sectional view taken along line A-A' of FIG. 1. A difference between the image sensor 100 shown in FIGS. 1 through 3 and the image sensor 100a of FIG. 4 is described.

Referring to FIG. 4, the image sensor 100a may include a pixel isolation structure 150a. The pixel isolation structure 150a may extend into the substrate 110 below a first surface 110a of a substrate 110. The pixel isolation structure 150a may further include a portion on the first surface 110a of the substrate 110. A deep trench DTa may be recessed into the substrate 110 from the first surface 110a of the substrate 110. The pixel isolation structure 150a may cover the first surface 110a of the substrate 110 and fill the deep trench DTa. The deep trench DTa may be formed using a back-side DTI (BDTI) process. For example, the deep trench DTa may be formed by etching the substrate 110 from the first surface 110a of the substrate 110, which is a back surface thereof.

A first doped region PLADa may be provided around a portion of the pixel isolation structure 150a extending into the substrate 110. For example, when viewed in cross-section, the first doped region PLADa may contact a side surface of the pixel isolation structure 150a, and may extend horizontally from the pixel isolation structure 150a into the substrate 110. A transfer gate TGa may not be recessed into the substrate 110. For example, the transfer gate TGa may be provided on and may contact the second surface 110b of the substrate 110. A first shallow trench ST1 may not be connected to the deep trench DTa. For example, the first shallow trench ST1 may be spaced apart from the deep trench DTa in the vertical direction (Z direction), and a portion of the substrate 110 may be interposed between the first shallow trench ST1 and the deep trench DTa. The first portion 120a of the device isolation layer 120 may not contact the pixel isolation structure 150. For example, the first portion 120a of the device isolation layer 120 may be spaced apart from the pixel isolation structure 150 in the vertical direction (Z direction).

Figure 5:
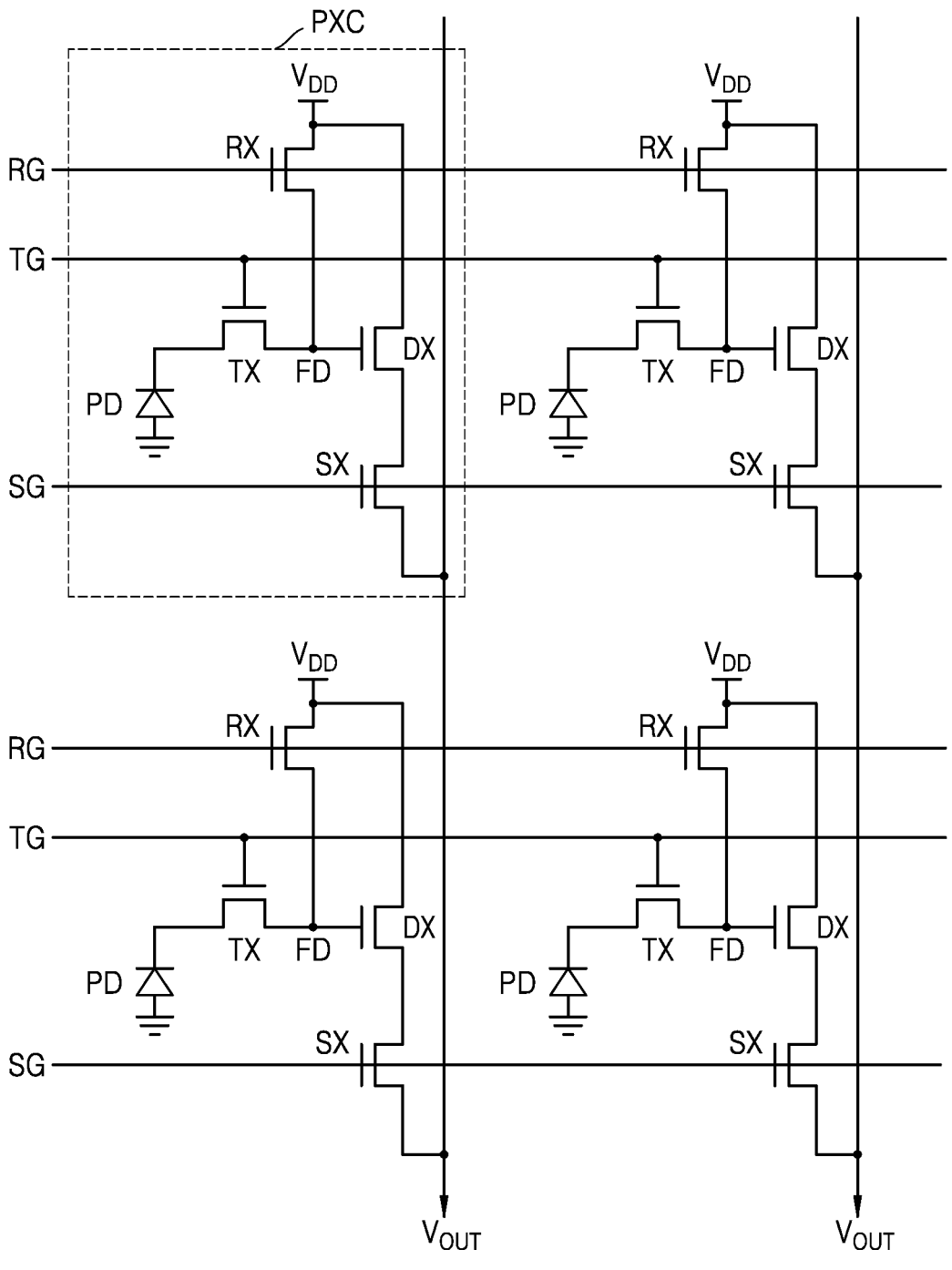
FIG. 5 is an equivalent circuit diagram of a plurality of pixel circuits included in an image sensor, according to example embodiments of the inventive concept.

FIG. 5 is an equivalent circuit diagram of a plurality of pixel circuits PXC included in an image sensor, according to example embodiments of the inventive concept.

Referring to FIG. 5, the pixel circuits PXC may be arranged in a matrix form. Each of the pixel circuits PXC may include a transfer transistor TX and logic transistors. In this case, the logic transistors may include a reset transistor RX, a select transistor SX, and a drive transistor DX (or a source follower transistor). The reset transistor RX may include a reset gate RG, the select transistor SX may include a select gate SG, the transfer transistor TX may include a transfer gate TG, and the drive transistor DX may include a drive gate DG (see, e.g., FIG. 1).

Each of the pixel circuits PXC may further include a photoelectric conversion region PD and a floating diffusion region FD. The photoelectric conversion region PD may generate and accumulate photocharges in proportion to the amount of light incident from outside.

The transfer gate TG may transfer charges generated in the photoelectric conversion region PD to the floating diffusion region FD. The floating diffusion region FD may receive and cumulatively store charges generated in the photoelectric conversion region PD. The drive transistor DX may be controlled according to the amount of photocharges accumulated in the floating diffusion region FD.

The reset transistor RX may periodically reset charges accumulated in the floating diffusion region FD. The reset transistor RX includes a drain electrode connected to the floating diffusion region FD and a source electrode connected to a power supply voltage VDD. When the reset transistor RX is turned on, the power supply voltage VDD connected to the source electrode of the reset transistor RX is transmitted to the floating diffusion region FD. When the reset transistor RX is turned on, charges accumulated in the floating diffusion region FD may be discharged through the reset transistor RX so that the floating diffusion region FD may be reset.

The drive transistor DX may be connected to a current source (not shown) located outside a plurality of pixels PX to function as a source follower buffer amplifier. The drive transistor DX amplifies a change in electric potential of the floating diffusion region FD and outputs the result to an output line $V_{OUT}$.

The select transistor SX may select a plurality of pixel circuits PXC on a row-by-row basis. When the select transistor SX is turned on, the power supply voltage VDD may be transmitted to a source electrode of the drive transistor DX.

FIGS. 6A through 6I are cross-sectional views illustrating a method of manufacturing the image sensor 100, according to example embodiments of the inventive concept. FIGS. 6A through 6I correspond to cross-sectional views taken along line A-A' of FIG. 1.

Figure 6A:
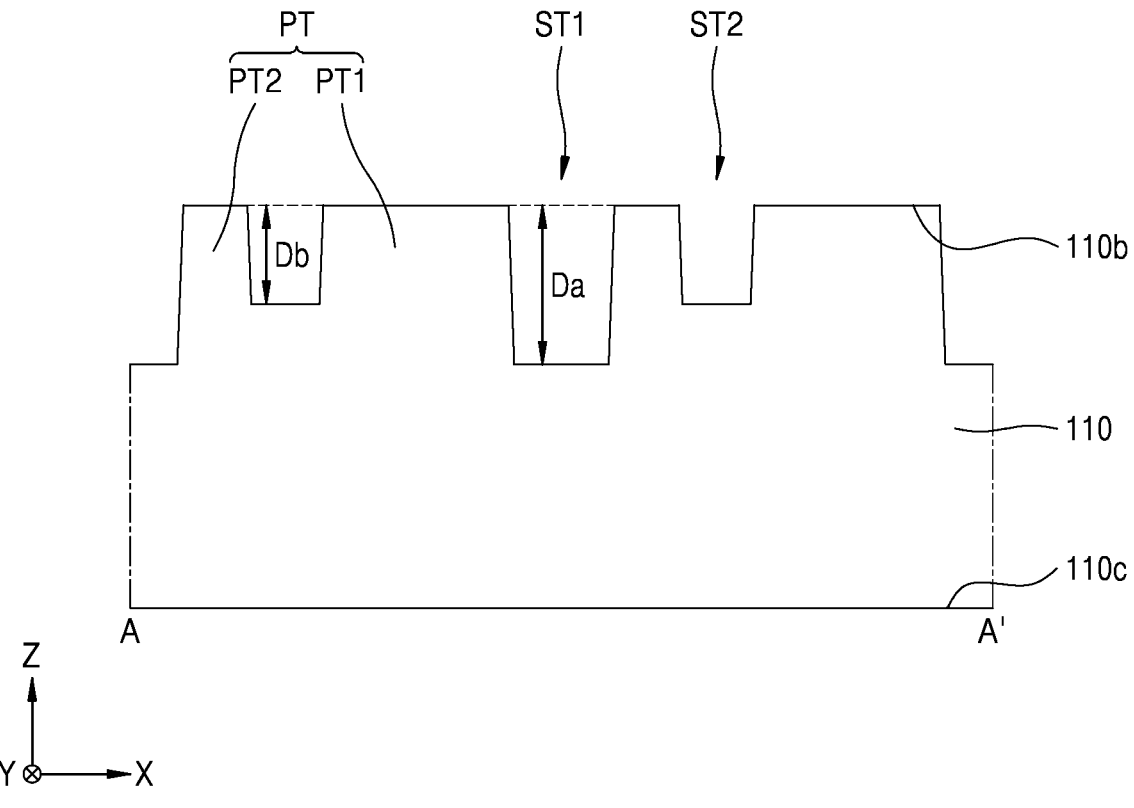
FIGS. 6A through 6I are cross-sectional views illustrating a method of manufacturing an image sensor, according to example embodiments of the inventive concept.

Referring to FIG. 6A, a substrate 110 having a second surface 110b and a third surface 110c opposite to each other is prepared. A first shallow trench ST1 is formed recessed into the substrate 110 from the second surface 110b of the substrate 110 to a first depth Da, and a second shallow trench ST2 is formed recessed into the substrate 110 from the second surface 110b of the substrate 110 to a second depth Db. The first shallow trench ST1 may be formed by etching the substrate 110 from the second surface 110b of the substrate 110 to the first depth Da. The second shallow trench ST2 may be formed by etching the substrate 110 from the second surface 110b of the substrate 110 to the second depth Db. In some embodiments, after the first shallow trench ST1 is formed, the second shallow trench ST2 may be formed. In another embodiment, the second shallow trench ST2 may be formed first, and the first shallow trench ST1 may be formed subsequently. By forming the first and second shallow trenches ST1 and ST2, a pattern PT including first and second patterns PT1 and PT2 may be defined.

Figure 6B:
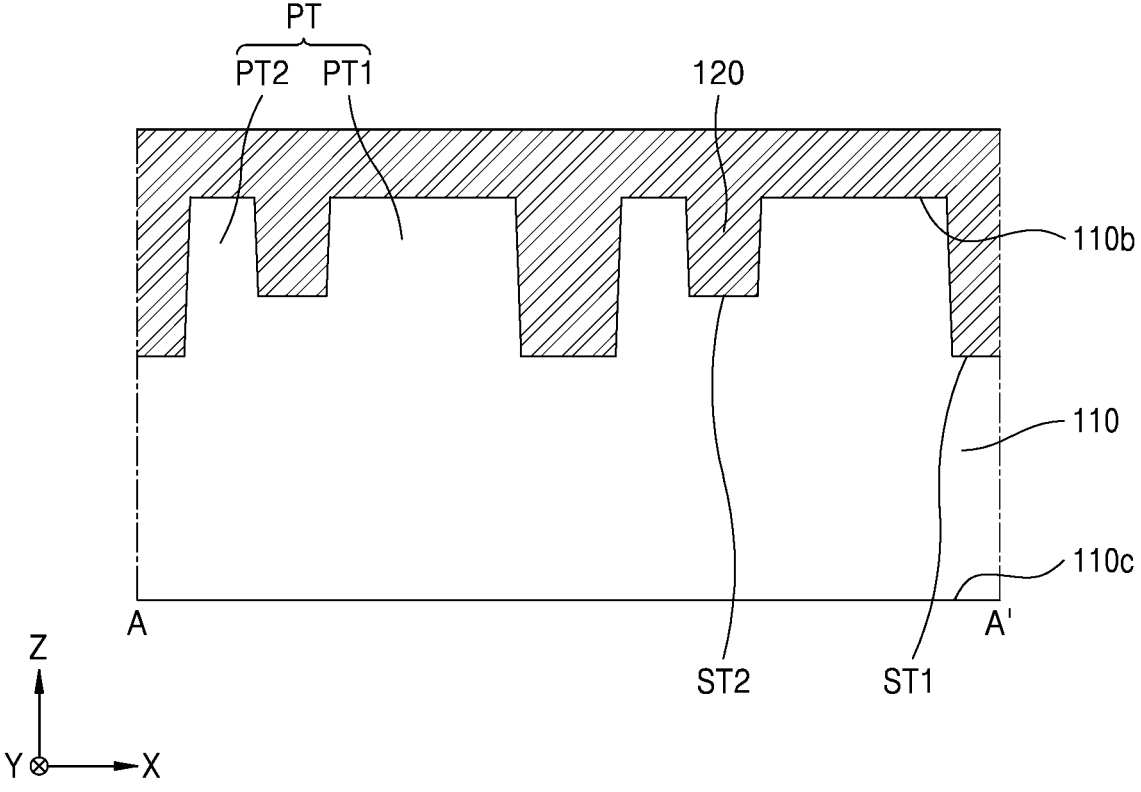

Referring to FIG. 6B, a device isolation layer 120 may be formed on the second surface 110b of the substrate 110, the first shallow trench ST1 in the substrate 110, and the second shallow trench ST2 in the substrate 110. The device isolation layer 120 may include a portion filling the first shallow trench ST1, a portion filling the second shallow trench ST2, and a portion covering the second surface 110b of the substrate 110.

Figure 6C:
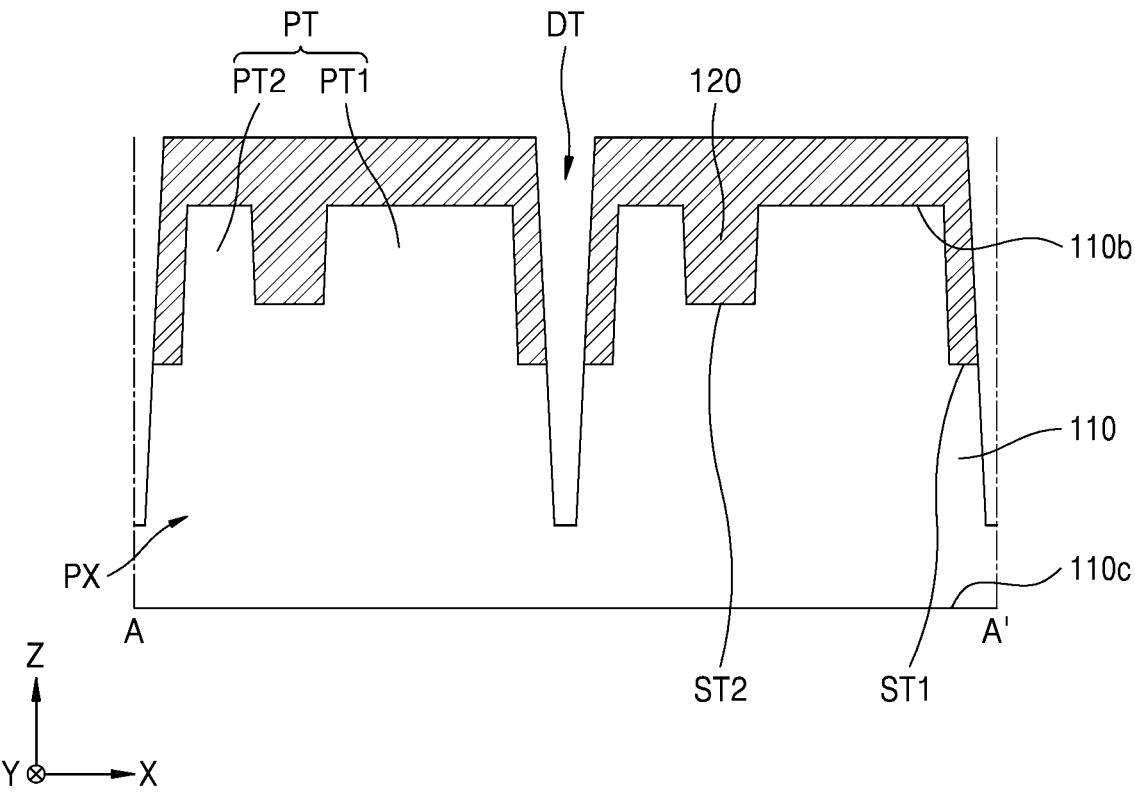

Referring to FIG. 6C, a deep trench DT recessed into the substrate 110 through the device isolation layer 120 may be formed. The deep trench DT may be formed by etching the device isolation layer 120 and the substrate 110. The deep trench DT may not completely penetrate the substrate 110. For example, the deep trench DT may not reach a third surface 110c of the substrate 110. A pixel region PX may be defined by forming the deep trench DT.

Figure 6D:
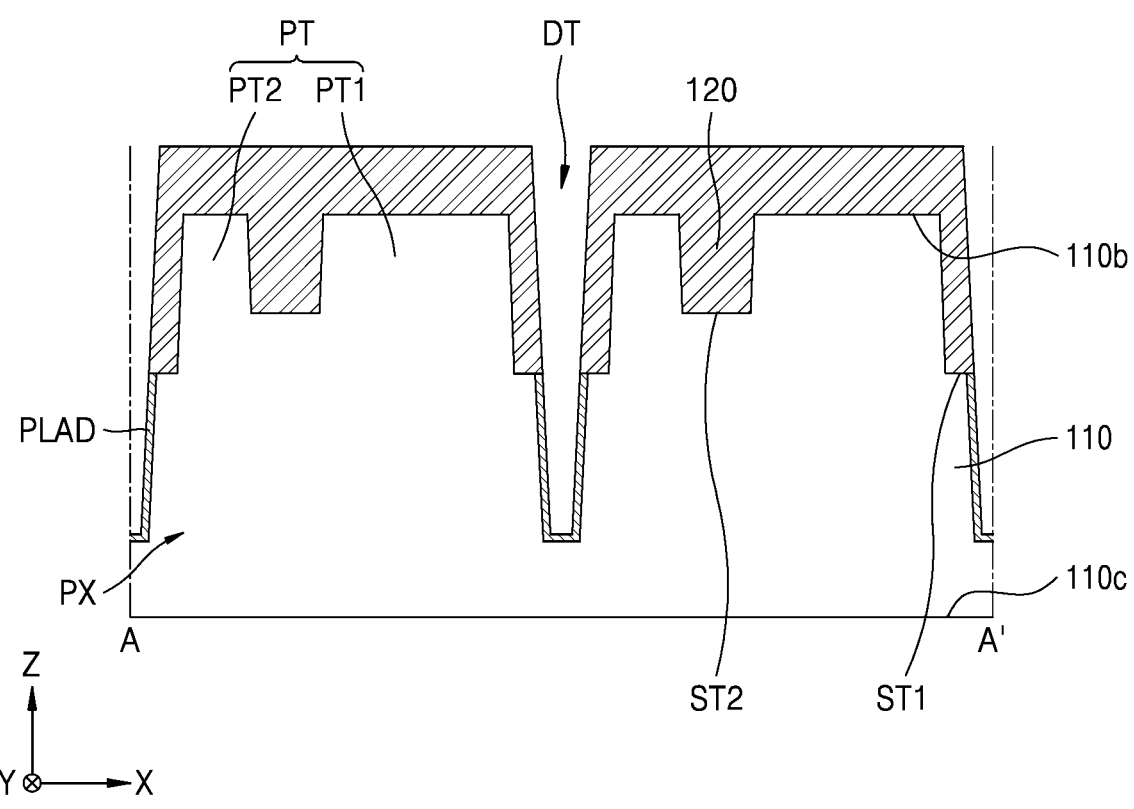

Referring to FIG. 6D, a first doped region PLAD may be formed around a portion of the deep trench DT under the first shallow trench ST1. The first doped region PLAD may mitigate an increase in dark level current due to damage caused by etching of the deep trench DT.

Figure 6E:
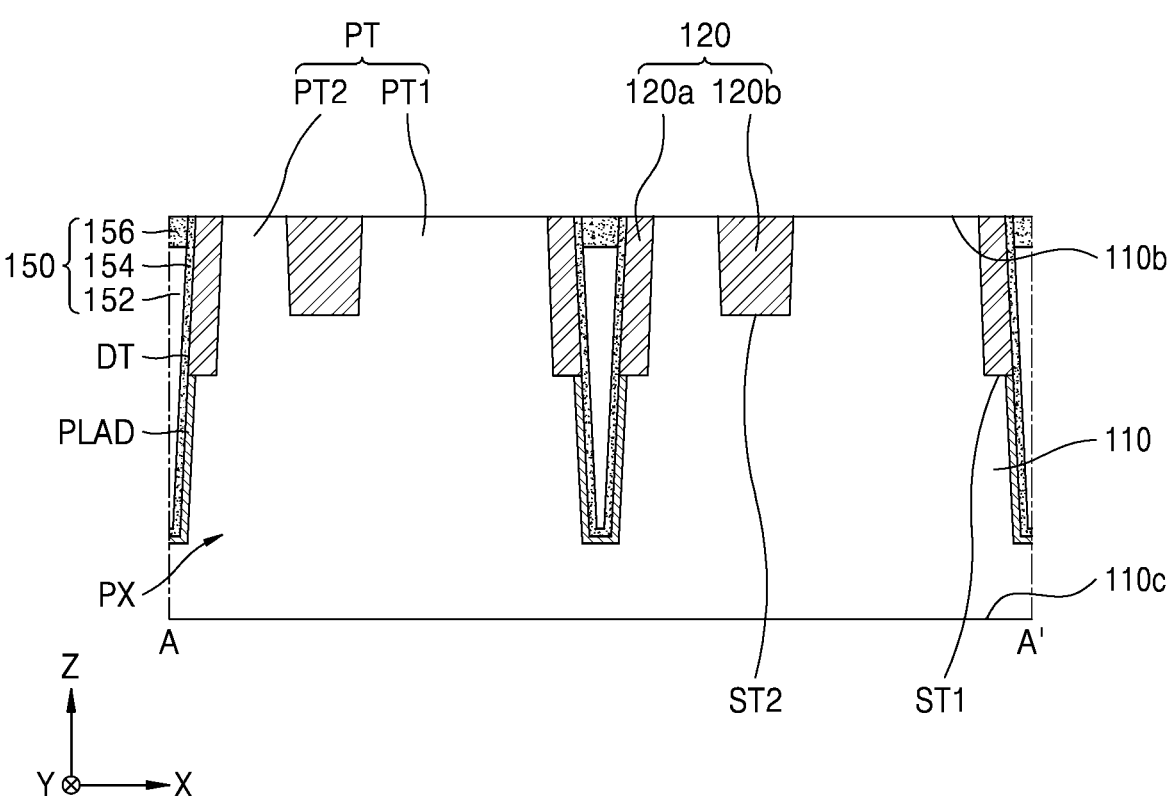

Referring to FIG. 6E, a pixel isolation structure 150 may be formed in the deep trench DT. For example, an insulating pattern 154 may be conformally formed in the deep trench DT and on the device isolation layer 120. Furthermore, a conductive pattern 152 may be formed on the insulating pattern 154 to fill the remaining portion of the deep trench DT. For example, an upper portion of the conductive pattern 152 may be removed using an etch-back process. A capping pattern 156 may be formed on the conductive pattern 152 and the insulating pattern 154. The device isolation layer 120, the insulating pattern 154, and the capping pattern 156 may be then planarized to expose the second surface 110b of the substrate 110. Accordingly, the first portion 120a of the device isolation layer 120 in the first shallow trench ST1, the second portion 120b of the device isolation layer 120 in the second shallow trench ST2, and the pixel isolation structure 150 may remain.

Figure 6F:
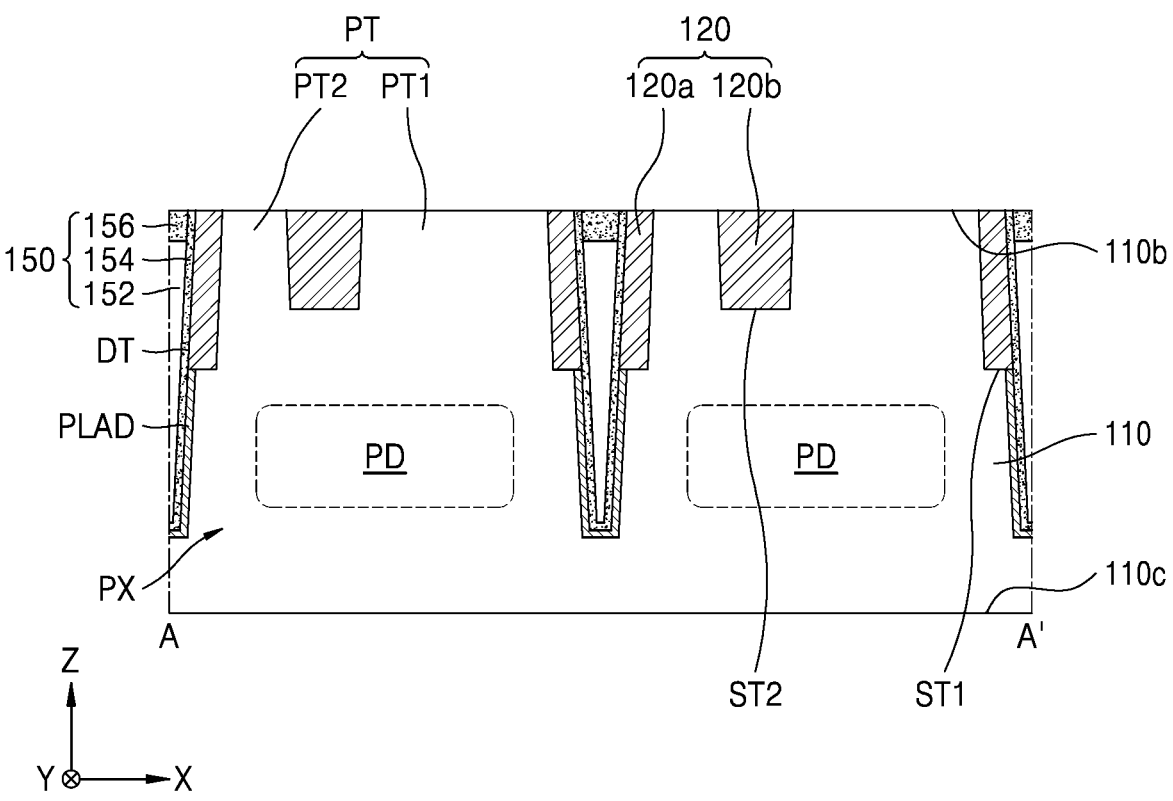

Referring to FIG. 6F, a photoelectric conversion region PD may be formed in a pixel region PX defined by the deep trench DT. For example, the photoelectric conversion region PD may be formed by forming a doped region in the pixel region PX.

Figure 6G:
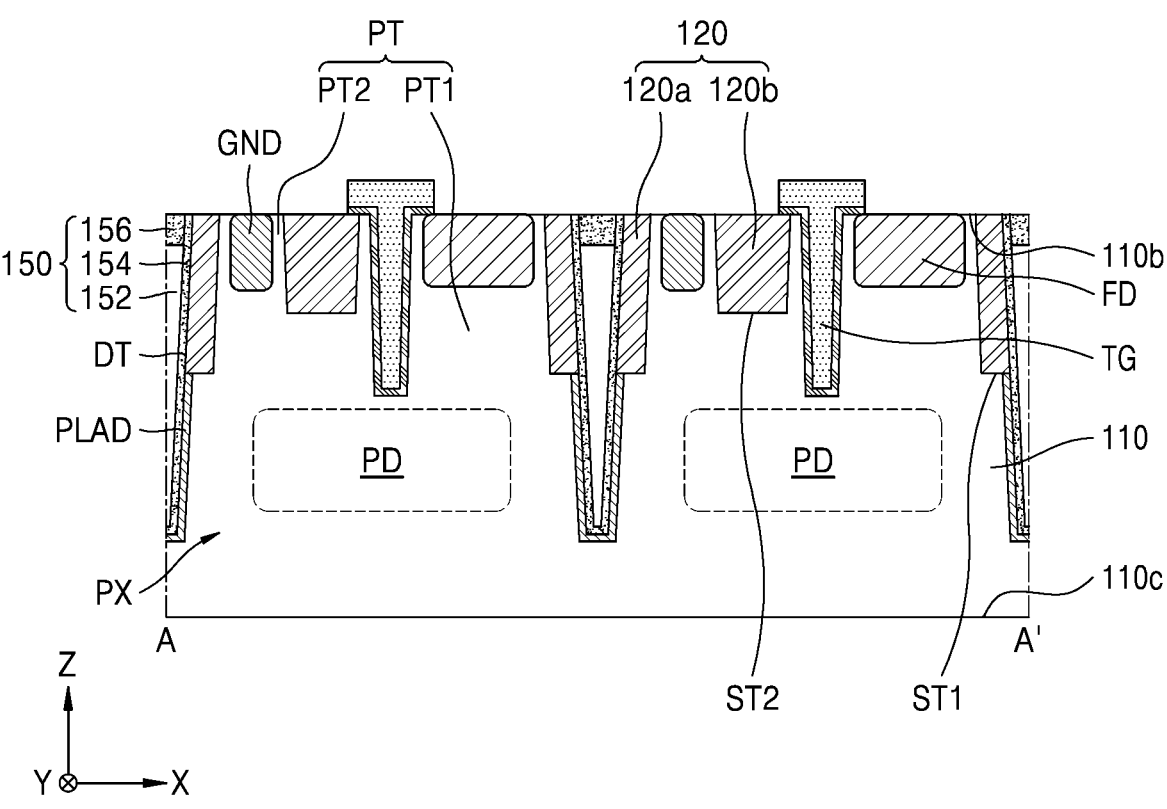

Referring to FIG. 6G, a transfer gate TG recessed into the substrate 110 from the second surface 110b of the substrate 110 may be formed. Furthermore, a second doped region FD may be formed in the first pattern PT1. Furthermore, a third doped region GND may be formed in the second pattern PT2. In addition, a reset gate (e.g., reset gate RG in FIG. 5), a drive gate (e.g., drive gate DG in FIGS. 1 and 5), and a select gate (e.g., select gate SG in FIGS. 1 and 5) may be formed on the first pattern PT1.

Figure 6H:
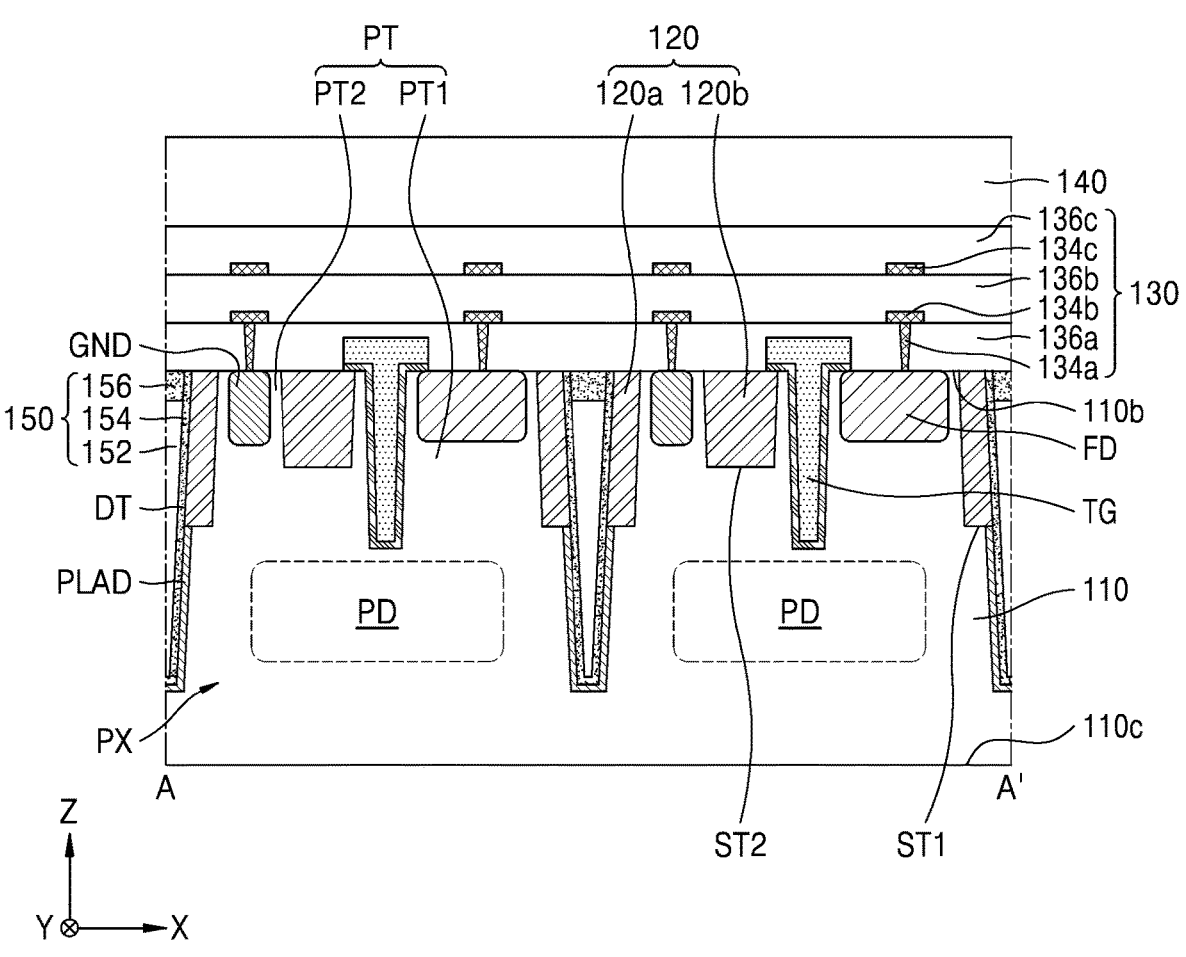

Referring to FIG. 6H, a front structure 130 may be formed on the second surface 110b of the substrate 110. For example, a first insulating layer 136a may be formed on the second surface 110b of the substrate 110. A plurality of contacts 134a may then be formed to penetrate the first insulating layer 136a. Next, a first wiring layer 134b may be formed on the first insulating layer 136a. Then, a second insulating layer 136b may be formed on the first insulating layer 136a and the first wiring layer 134b. Subsequently, a second wiring layer 134c may be formed on the second insulating layer 136b. Next, a third insulating layer 136c may be formed on the second wiring layer 134c and the second insulating layer 136b.

Thereafter, a support substrate 140 may be bonded to the front structure 130.

Figure 6I:
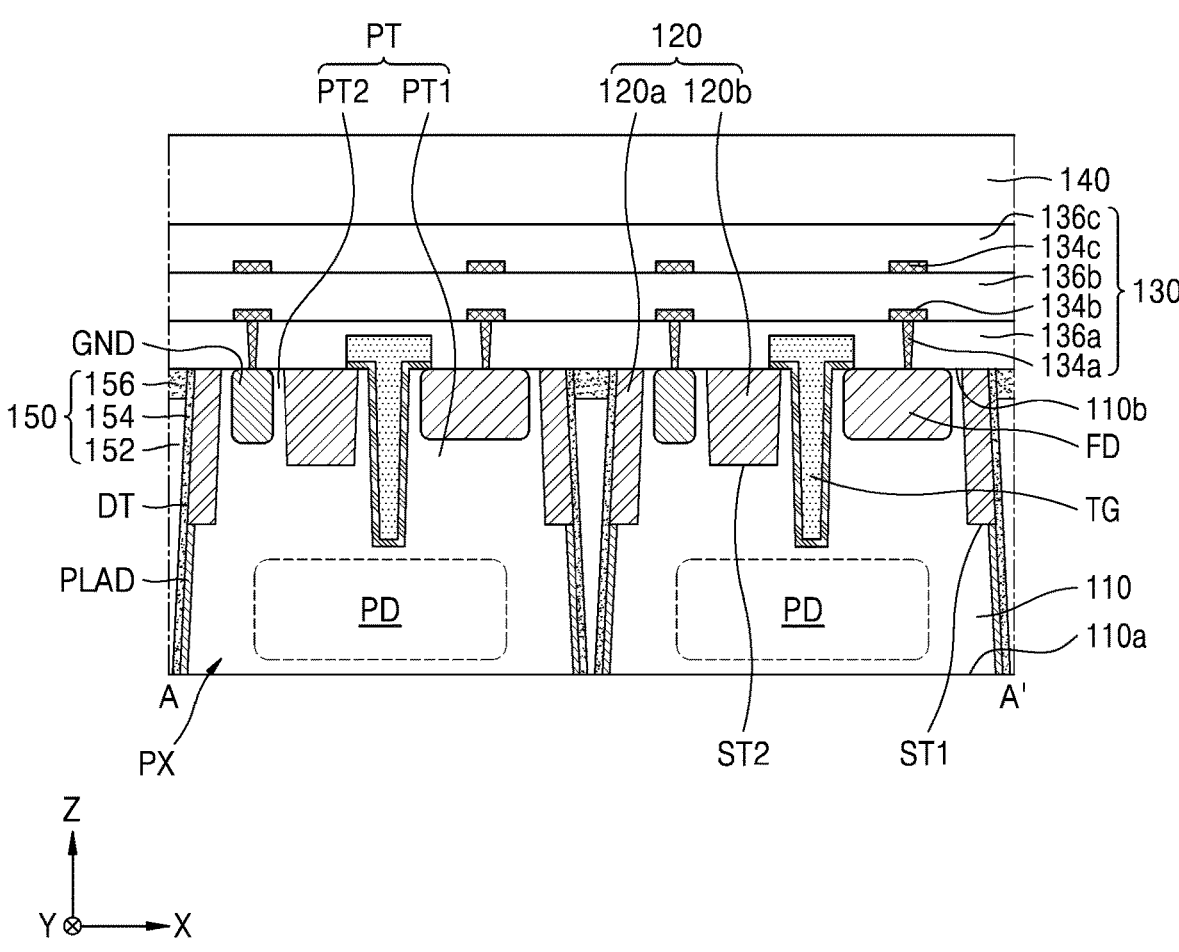

Referring to FIGS. 6H and 6I, the third surface 110c of the substrate 110 may be polished to form a first surface 110a of the substrate 110. The conductive pattern 152 of the pixel isolation structure 150 may be exposed through the first surface 110a of the substrate 110. Thus, the deep trench DT and the pixel isolation structure 150 may penetrate the substrate 110 from the first surface 110a to the second surface 110b of the substrate 110.

Referring to FIGS. 2 and 3, the backside anti-reflective layer 161 may be formed on the first surface 110a of the substrate 110 and the pixel isolation structure 150. Next, the fence 163 may be formed on the backside anti-reflective layer 161. Then, the color filter 170 may be formed on the backside anti-reflective layer 161. Subsequently, the micro lens 180 may be formed on the color filter 170 and the fence 163. Finally, the capping layer 190 may be formed on the micro lens 180. After forming the capping layer 190, the image sensor 100 shown in FIGS. 1 through 3 may be completely manufactured.

FIGS. 7A through 7E are cross-sectional views illustrating a method of manufacturing the image sensor 100a, according to example embodiments of the inventive concept. FIGS. 7A through 7E correspond to cross-sectional views taken along line A-A' of FIG. 1.

Figure 7A:
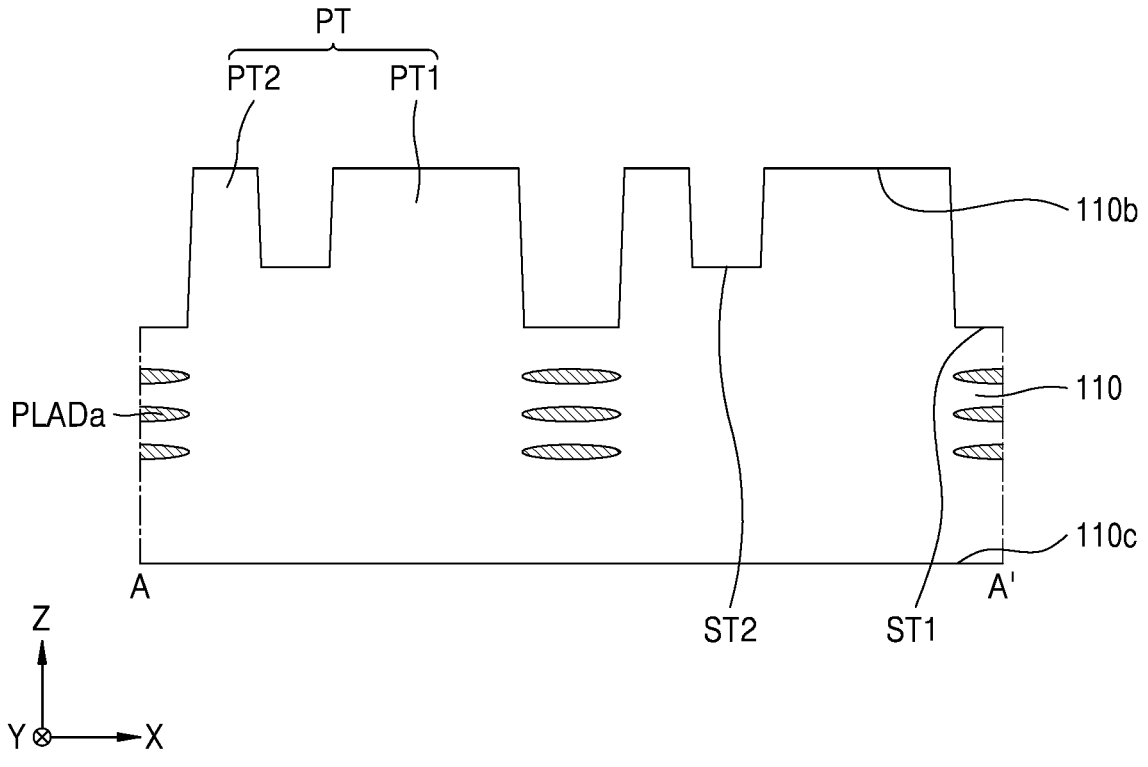
FIGS. 7A to 7E are cross-sectional views illustrating a method of manufacturing an image sensor, according to example embodiments of the inventive concept.

Referring to FIG. 7A, a substrate 110 having a second surface 110b and a third surface 110c opposite to each other is prepared. First and second shallow trenches ST1 and ST2 are formed recessed into the substrate 110 from the second surface 110b of the substrate 110. One of the first and second shallow trenches ST1 and ST2 may be formed first, and the other of the first and second shallow trenches ST1 and ST2 may be formed subsequently.

Then, a first doped region PLADa may be formed below the first shallow trench ST1.

Figure 7B:
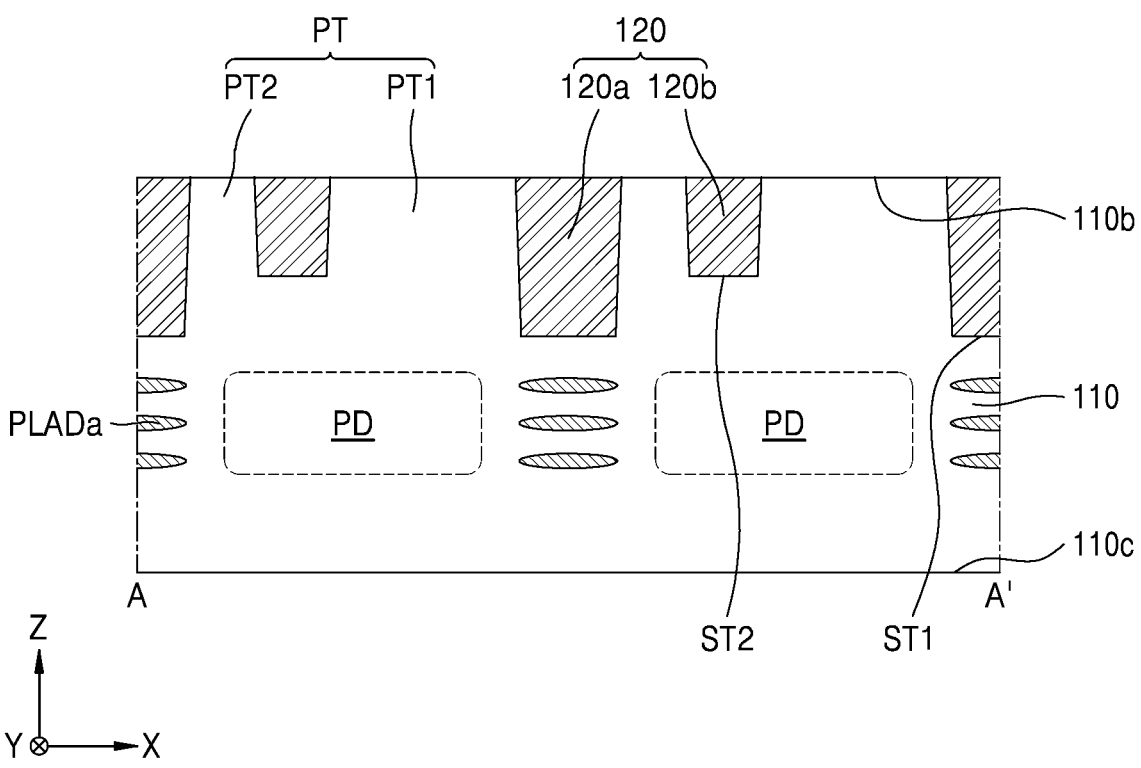

Referring to FIG. 7B, a photoelectric conversion device PD may be formed in the substrate 110.

Next, the device isolation layer 120 may be formed on the second surface 110b of the substrate 110, the first shallow trench ST1 in the substrate 110, and the second shallow trench ST2 in the substrate 110. The device isolation layer 120 may then be planarized to expose the second surface 110b of the substrate 110. A first portion 120a of the device isolation layer 120 filling the first shallow trench ST1 and a second portion 120b of the device isolation layer 120 filling the second shallow trench ST2 may remain.

Figure 7C:
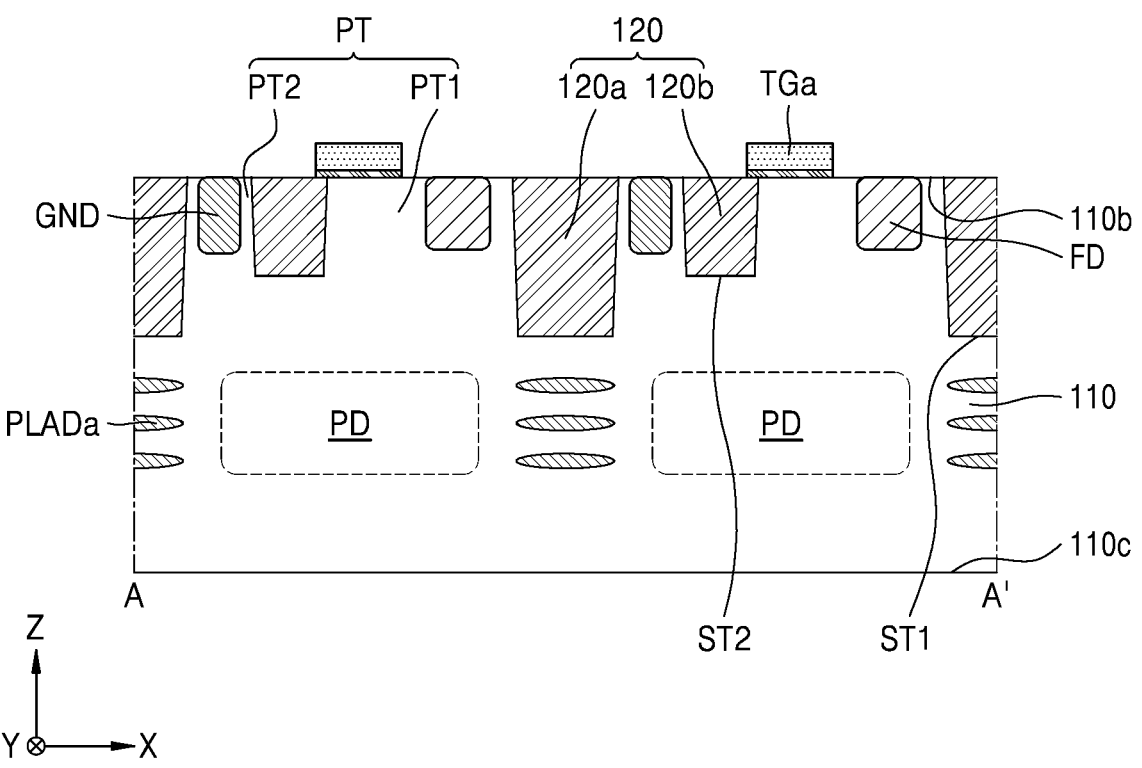

Referring to FIG. 7C, a transfer gate TGa may be formed on a first pattern PT1. Furthermore, a second doped region FD may be formed in the first pattern PT1. In addition, a third doped region GND may be formed in a second pattern PT2.

Figure 7D:
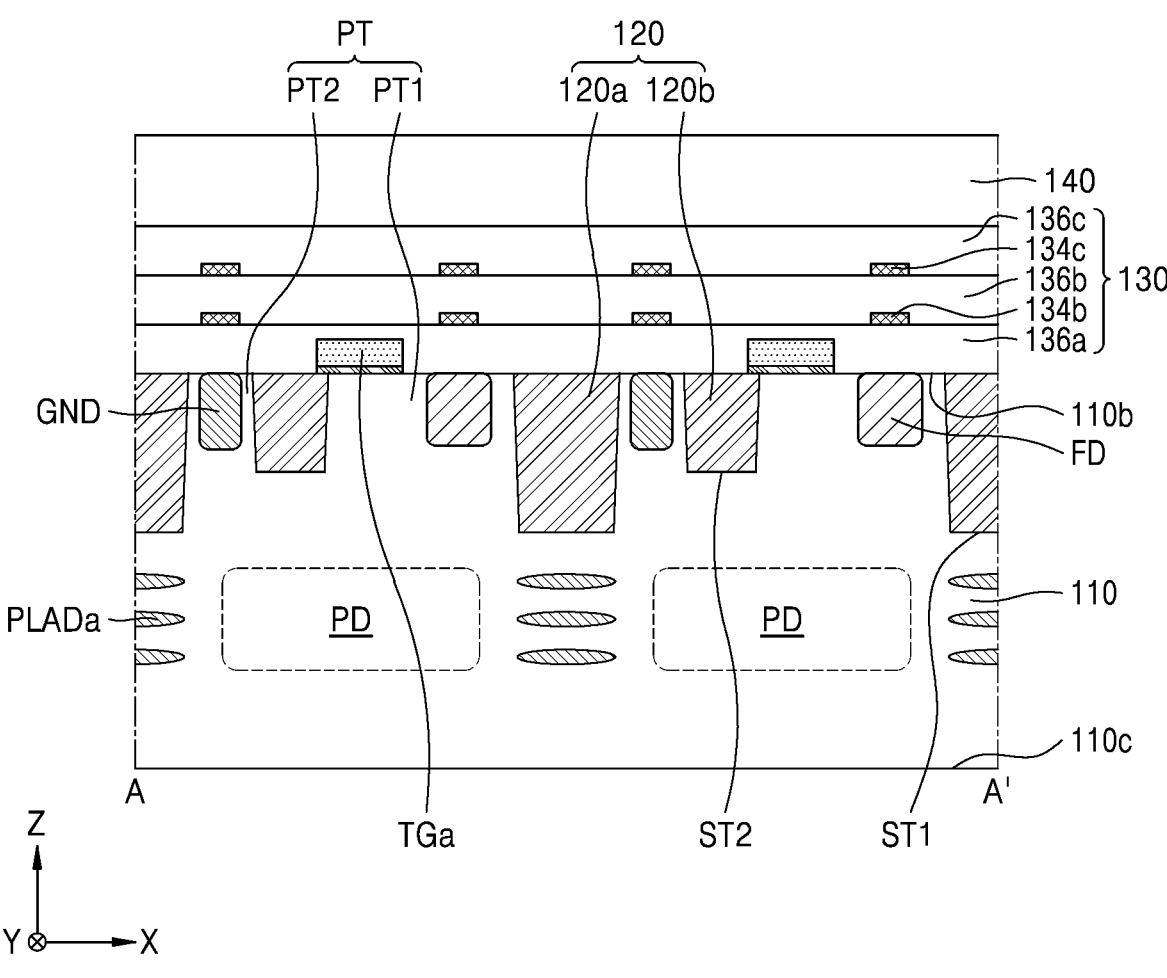

Referring to FIG. 7D, a front structure 130 may be formed on the second surface 110b of the substrate 110 and the device isolation layer 120. A support substrate 140 may be selectively formed on the front structure 130.

Figure 7E:
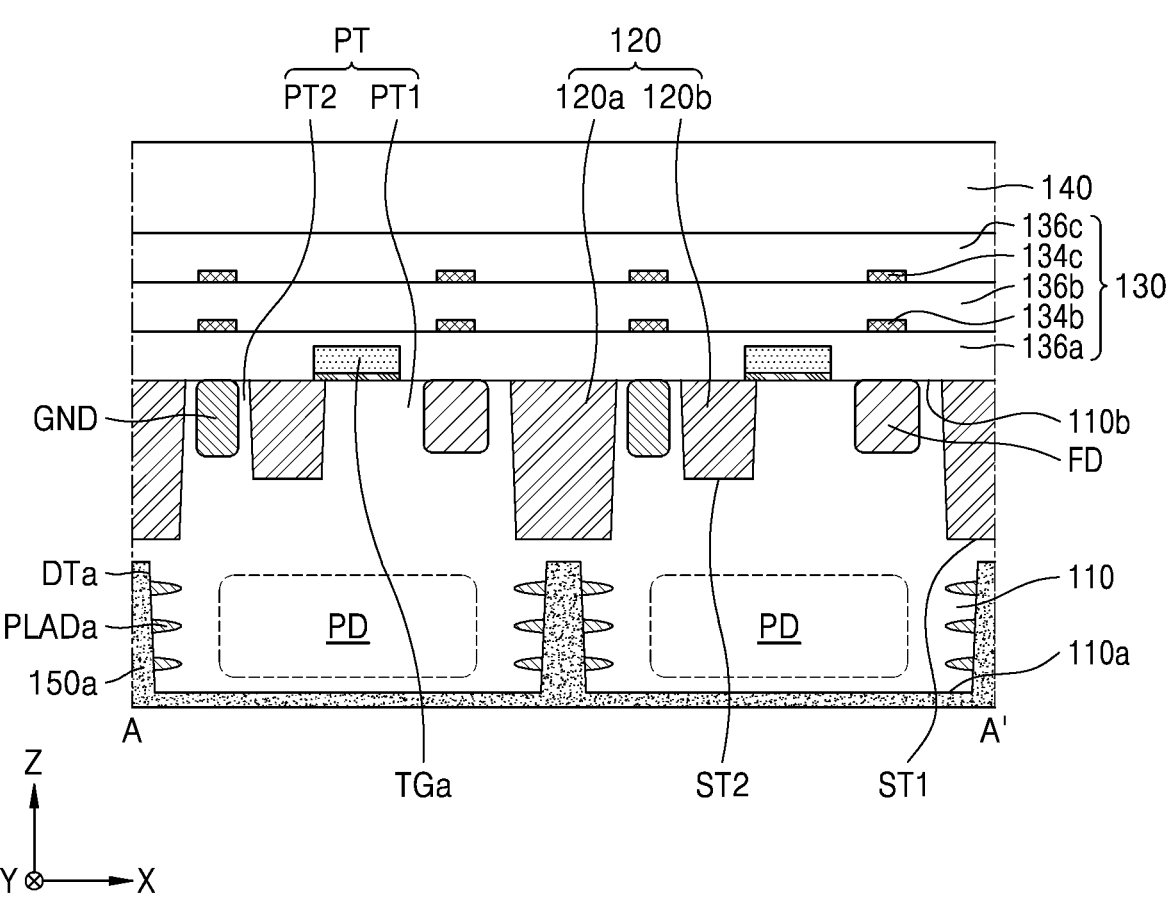

Referring to FIGS. 7D and 7E, the substrate 110 may be polished from the third surface 110c of the substrate 110 to form a first surface 110a of the substrate 110.

Next, a deep trench DTa may be formed in the substrate 110 to extend from the first surface 110a of the substrate 110 toward the first shallow trench ST1. A pixel isolation structure 150a may be formed on the deep trench DTa and the first surface 110a of the substrate 110.

Referring to FIG. 4, the backside anti-reflective layer 161 may be formed on the pixel isolation structure 150a. Next, the fence 163 may be formed on the backside anti-reflective layer 161. Then, the color filter 170 may be formed on the backside anti-reflective layer 161. Subsequently, the micro lens 180 may be formed on the color filter 170 and the fence 163. Finally, the capping layer 190 may be formed on the micro lens 180. After forming the capping layer 190, the image sensor 100a shown in FIG. 4 may be completely manufactured.

While the inventive concept has been particularly shown and described with reference to embodiments thereof, it will be understood that various changes in form and details may be made therein without departing from the spirit and scope of the following claims.

What is claimed is:

1. An image sensor comprising:
a substrate having a first surface on which light is incident and a second surface opposite to the first surface;
a pixel isolation structure enclosing a pixel region in the substrate;
a photoelectric conversion region in the pixel region;
a first doped region contacting the pixel isolation structure in the pixel region; and a device isolation layer defining a pattern in the pixel region,
wherein the device isolation layer includes a first portion contacting a side surface of the pixel isolation structure and a second portion spaced apart from the pixel isolation structure,
wherein the first portion has a first surface which is coplanar with the first surface of the substrate and a second surface opposite to the first surface,
wherein the first portion and the second portion are in material continuity with each other,
wherein the first portion of the device isolation layer is between the side surface of the pixel isolation structure and the second portion of the device isolation layer,
wherein the device isolation layer extends from the second surface of the substrate into the substrate,
wherein a length of the second portion of the device isolation layer in a vertical direction perpendicular to the first surface of the substrate is less than a length of the first portion of the device isolation layer in the vertical direction, and
wherein the first doped region contacts the second surface of the first portion.

2. The image sensor of claim 1, wherein the first portion of the device isolation layer contacts the pixel isolation structure along a perimeter of the pixel region.

3. The image sensor of claim 1, further comprising:
a second doped region in the pattern,
wherein impurities in the first doped region have a different conductivity type from that of impurities in the second doped region, and
wherein the first portion of the device isolation layer is above the first doped region.

4. The image sensor of claim 3, wherein the second doped region comprises a floating diffusion region.

5. The image sensor of claim 1, wherein the pixel isolation structure penetrates the substrate from the first surface to the second surface of the substrate.

6. The image sensor of claim 1, wherein a width of the pixel isolation structure on the first surface of the substrate is less than a width of the pixel isolation structure on the second surface of the substrate.

7. The image sensor of claim 1, further comprising a transfer gate extending from the second surface of the substrate into the substrate.

8. The image sensor of claim 1, further comprising:
a second doped region in the pattern,
wherein the pattern includes first and second patterns spaced apart from each other,
wherein the second doped region is located in the first pattern,
wherein the image sensor further comprises a third doped region in the second pattern, and
wherein impurities in the third doped region have a different conductivity type from that of impurities in the second doped region.

9. The image sensor of claim 8, wherein the third doped region is electrically grounded.

10. The image sensor of claim 8, wherein a portion of the second portion of the device isolation layer extends between the first and second patterns.

11. An image sensor comprising:
a substrate having a first surface on which light is incident and a second surface opposite to the first surface;
a pixel isolation structure in a deep trench, which defines a pixel region in the substrate, the pixel isolation structure having a first surface and a second surface opposite to the first surface;

a photoelectric conversion region in the pixel region; and a device isolation layer provided in first and second shallow trenches and defining a pattern in the pixel region, wherein the first surface of the pixel isolation structure is coplanar with the first surface of the substrate and the second surface of the pixel isolation structure is coplanar with the second surface of the substrate, wherein the first shallow trench is recessed into the substrate from the second surface of the substrate to a first depth in a vertical direction perpendicular to the first surface of the substrate, and connected to the deep trench, wherein the second shallow trench is recessed into the substrate from the second surface of the substrate to a second depth in the vertical direction, and connected to the first shallow trench, and wherein the first depth is greater than the second depth.

12. The image sensor of claim 11, wherein the first shallow trench is connected to the deep trench along a perimeter of the pixel region.

13. The image sensor of claim 11, further comprising:

a first doped region contacting the pixel isolation structure in the pixel region and a second doped region in the pattern, wherein impurities in the first doped region have a different conductivity type from that of impurities in the second doped region, and wherein the first shallow trench is above the first doped region.

14. The image sensor of claim 11, wherein the deep trench penetrates the substrate from the first surface to the second surface of the substrate.

15. The image sensor of claim 11, wherein the substrate has a step height difference at a boundary between the first and second shallow trenches.

16. The image sensor of claim 11, wherein the pattern includes first and second patterns spaced apart from each other, and wherein a portion of the second shallow trench extends between the first and second patterns.

17. The image sensor of claim 11, further comprising:

a transfer gate recessed into the substrate from the second surface of the substrate to a third depth in the vertical direction, wherein the third depth is greater than the second depth.

18. The image sensor of claim 17, wherein the third depth is greater than the first depth.

19. An image sensor comprising:

a substrate having a first surface and a second surface opposite to each other;

a micro lens on the first surface of the substrate;

a pixel isolation structure in a deep trench, which defines a pixel region in the substrate, the pixel isolation structure having a first surface and a second surface opposite to the first surface;

a photoelectric conversion region in the pixel region;

a first doped region contacting the pixel isolation structure in the pixel region;

a device isolation layer provided in first and second shallow trenches and defining a pattern in the pixel region; and a second doped region in the pattern, wherein the first surface of the pixel isolation structure is coplanar with the first surface of the substrate and the second surface of the pixel isolation structure is coplanar with the second surface of the substrate, wherein impurities in the first doped region have a different conductivity type from that of impurities in the second doped region, wherein the first shallow trench is recessed into the substrate from the second surface of the substrate to a first depth in a vertical direction perpendicular to the first surface of the substrate, and connected to the deep trench, wherein the second shallow trench is recessed into the substrate from the second surface of the substrate to a second depth in the vertical direction, and connected to the first shallow trench, wherein the first shallow trench is above the first doped region, and wherein the first depth is greater than the second depth.

20. The image sensor of claim 19, wherein a difference between the first and second depths ranges from about 1000 Å to about 2800 Å.

* * * * *